(12) United States Patent
Padiyath et al.

(10) Patent No.: US 7,858,976 B2
(45) Date of Patent: Dec. 28, 2010

(54) METHOD OF MAKING AN ORGANIC LIGHT EMITTING DEVICE

(75) Inventors: Raghunath Padiyath, Woodbury, MN (US); Jon E. Ottman, Eagan, MN (US); David A. Engler, Woodbury, MN (US); Fred B. McCormick, Maplewood, MN (US); Donald J. McClure, Siren, WI (US); Brian J. Gates, Eagan, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 226 days.

(21) Appl. No.: 12/132,651

(22) Filed: Jun. 4, 2008

(65) Prior Publication Data
US 2008/0230777 A1 Sep. 25, 2008

Related U.S. Application Data

(62) Division of application No. 10/701,329, filed on Nov. 4, 2003, now Pat. No. 7,432,124.

(51) Int. Cl.
*H01L 51/00* (2006.01)
(52) U.S. Cl. .................... 257/40; 257/E51.022
(58) Field of Classification Search .................. 257/40, 257/642, 759, E51.022
See application file for complete search history.

(56) References Cited

U.S. PATENT DOCUMENTS

| 4,138,620 | A | 2/1979 | Dickson |
| 5,408,109 | A | 4/1995 | Heeger et al. |
| 5,929,562 | A | 7/1999 | Pichler |
| 5,949,188 | A | 9/1999 | Leising et al. |
| 6,042,894 | A | 3/2000 | Goto et al. |
| 6,107,734 | A | 8/2000 | Tanaka et al. |
| 6,137,221 | A * | 10/2000 | Roitman et al. ............. 313/504 |
| 6,345,903 | B1 | 2/2002 | Koike |
| 6,355,125 | B1 | 3/2002 | Tahon et al. |
| 6,410,201 | B2 | 6/2002 | Wolk et al. |
| 6,447,898 | B1 | 9/2002 | Pfaff |
| 6,479,941 | B1 | 11/2002 | Abe et al. |
| 6,525,467 | B1 | 2/2003 | Eida et al. |
| 6,534,581 | B1 | 3/2003 | Kleyer et al. |
| 6,579,422 | B1 | 6/2003 | Kakinuma |
| 6,593,690 | B1 | 7/2003 | McCormick et al. |
| 6,621,213 | B2 | 9/2003 | Kawashima |
| 6,649,433 | B2 | 11/2003 | Mikhael et al. |
| 6,664,730 | B2 * | 12/2003 | Weaver ....................... 313/504 |
| 6,787,990 | B2 | 9/2004 | Cok |

(Continued)

FOREIGN PATENT DOCUMENTS

EP 1115268 7/2001

(Continued)

OTHER PUBLICATIONS

Fault-tolerant, scalable organic light-emitting device architecture, 2003 American Institute of Physics, Applied Physics Letter, vol. 82, No. 16, Apr. 21, 2003, pp. 2580-2582.

*Primary Examiner*—Quoc D Hoang
(74) *Attorney, Agent, or Firm*—Carolyn A. Fischer

(57) ABSTRACT

The invention relates to a method of making an organic electronic device and articles.

15 Claims, 1 Drawing Sheet

U.S. PATENT DOCUMENTS

| | | |
|---|---|---|
| 6,794,815 B2 | 9/2004 | Lee et al. |
| 6,858,874 B2 | 2/2005 | Wu et al. |
| 6,867,539 B1 | 3/2005 | McCormick et al. |
| 6,936,964 B2 | 8/2005 | Cok |
| 6,952,079 B2 * | 10/2005 | Shiang et al. ............... 313/506 |
| 6,975,067 B2 | 12/2005 | McCormick et al. |
| 2001/0026126 A1 | 10/2001 | Nakaya et al. |
| 2002/0071082 A1 | 6/2002 | Okita et al. |
| 2002/0190661 A1 | 12/2002 | Duggal et al. |
| 2002/0196205 A1 | 12/2002 | Yamakado et al. |
| 2003/0011724 A1 | 1/2003 | Sundahl |
| 2003/0068525 A1 | 4/2003 | Bellmann et al. |
| 2004/0216625 A1 | 11/2004 | Birnstock et al. |
| 2005/0017628 A1 | 1/2005 | Prakash |
| 2005/0095736 A1 | 5/2005 | Padiyath et al. |

FOREIGN PATENT DOCUMENTS

| | | |
|---|---|---|
| EP | 1354638 | 10/2003 |
| JP | 09311737 | 12/1997 |
| JP | 10-208877 | 8/1998 |
| JP | 10-288952 | 10/1998 |
| JP | 10319879 | 12/1998 |
| JP | 2003195973 | 7/2001 |
| JP | 2002-367774 | 12/2002 |
| WO | WO 02/05361 | 1/2002 |
| WO | WO 03/006242 | 1/2003 |

* cited by examiner

METHOD OF MAKING AN ORGANIC LIGHT EMITTING DEVICE

RELATED APPLICATION

The application is a divisional of allowed U.S. patent application Ser. No. 10/701,329 filed Nov. 4, 2003 now U.S. Pat. No. 7,432,124.

FIELD OF THE INVENTION

The invention relates to a method of making an organic electronic device and articles.

BACKGROUND OF THE INVENTION

Organic electronic devices are articles that include layers of organic materials, at least one of which can conduct an electric current. An example of an organic electronic device is an organic light-emitting diode (OLED). OLEDs typically consist of an organic light emitter layer and optional organic charge transport layers on both sides of the emitter disposed between two electrodes: a cathode and an anode. OLEDs, sometimes referred to as lamps, are desirable for use in electronic media because of their thin profile, low weight, and low driving voltage, e.g., less than about 20 volts. OLEDs have potential use in applications such as backlighting of graphics, pixelated displays, and large emissive graphics.

A "roll-to-roll" method for making OLED devices includes forming the various layers on a web receptor substrate. In order to provide the proper arrangement of the various layers such as providing the cathode electrically isolated from the anode, multiple deposition and patterning steps are employed to manufacture the ultimate device structure. In particular, it is common practice to pattern the anode (e.g. indium-tin oxide), such as described in U.S. Pat. No. 6,410,201 and U.S. Pat. No. 6,579,422.

Although various OLED structures and methods of manufacture have been described, industry would find advantage in improved methods of manufacture.

SUMMARY OF THE INVENTION

The invention describes a method of making an organic light-emitting device wherein at least one electrode layer is continuous in the direction of the advancing web. In one embodiment, the method comprises advancing a web comprising a (e.g. transparent) flexible substrate such as a plastic film and applying a first electrode layer. In another embodiment, the advancing web comprises a conductive flexible substrate suitable for use as a first electrode layer or electrode contact. In either embodiment, the method comprises applying a light-emitting layer, and providing a second electrode layer electrically isolated from the first electrode layer.

The first electrode layer may be the anode and the second electrode layer the cathode, or vice-versa. The continuous electrode layer(s) may extend to the peripheral edges of the advancing substrate. The method may optionally comprise applying other layers such as an organic charge transport layer between the light-emitting layer and at least one of the electrode layers. The steps of the method may be conducted in a batch, step-wise or continuous process.

In one aspect, the first and/or second electrode layer may also be continuous in a direction perpendicular to the direction of the advancing web. In doing so, it is preferred to provide an insulating layer on a portion of the first electrode layer and/or a portion of the flexible substrate.

In another aspect, the first electrode layer may be applied in a pattern comprising at least two stripes. The stripes range from being substantially parallel to substantially diagonal to the direction of the advancing web. For embodiments wherein the first electrode layer is substantially diagonal, the second electrode layer is continuous in the direction of the advancing web. For embodiments wherein the first electrode layer is substantially parallel, the second electrode layer preferably comprises a stripe pattern aligned substantially perpendicular to the pattern of the first electrode layer. The electrode layer pattern(s) is preferably applied by means of applying a mask prior to applying the electrode layer and removing the mask after application.

Any of the methods described herein may further comprise cutting a portion from the web forming an organic-light emitting device having a dimension in the direction of the advancing web and an area. The electrode layer and light emitting layer and other functional layers such as the hole injection layer, the electron transport layer, etc. are preferably continuous beyond the dimensions of the device prior to cutting. The dimension may range up to about 10 inches. The continuous electrode layer and light emitting layer and other functional layers such as the hole injection layer, the electron transport layer, etc. are preferably continuous throughout the area of the device.

DETAILED DESCRIPTION OF THE PREFERRED EMBODIMENTS

As used herein, "organic electroluminescent device" refers to an article that includes a layer, or layers, of at least one organic electroluminescent material disposed between a first electrode and a second electrode. Typically, at least one of the electrodes can transmit light emitted by the organic electroluminescent material. The device typically comprises at least one flexible substrate layer that is continuous throughout the dimensions of the device.

Methods of preparing organic electroluminescent devices (OLEDs) are described. At least one of the electrode layers is continuous in the direction of the advancing web. Accordingly, the cathode layer may be continuous, the anode layer may be continuous, or both electrode layers may be continuous in the direction of the advancing web. Either or both electrode layers may also be continuous in the direction perpendicular to the direction of the advancing web (i.e. cross-web direction). Regardless of whether the continuous electrode layer is also continuous or discontinuous in the cross-web direction, the method of the invention further comprises applying an organic light-emitting (e.g. LEP) layer 518 and applying a second electrode layer 522 electrically isolated from the first electrode. The LEP layer is disposed between the first electrode and a second electrode.

Figure 1:
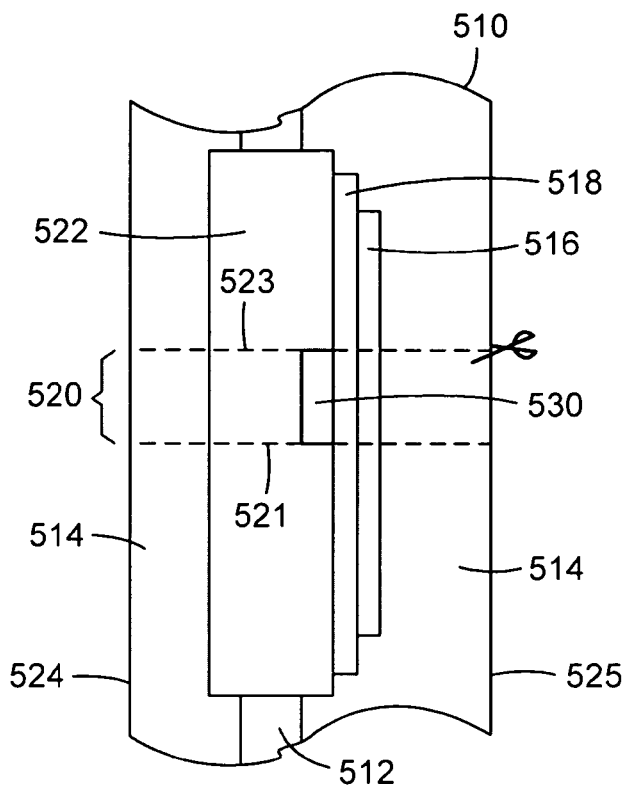
FIG. 1 depicts a plan view of an exemplary method of preparing organic light-emitting device.
Figure 2:
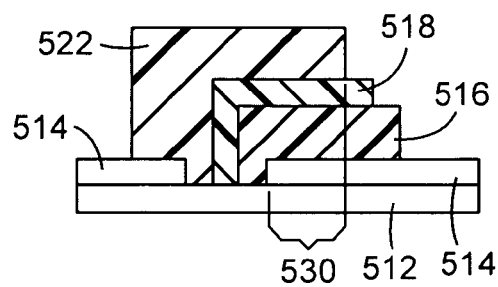
FIG. 2 depicts a cross-sectional view of the web of FIG. 1 after removal on the liner.

Although batch or step-wise processes may also be employed, the method of manufacturing the OLED device of the invention preferably employs a continuous roll-to-roll process. With reference to FIGS. 1 and 2, a flexible substrate web 512 is provided in a roll. In one aspect the flexible substrate may be a (e.g. transparent) polymeric film. Alternatively, the substrate may be formed in situ on a liner 510, for example, by coating a polymerizable material and curing the material in-line. For such embodiments, the method of the invention comprises applying a first electrode layer 514. Typically, the first electrode layer is applied directly to the flexible substrate. However, other optional layers such as an electrically insulating layer, a smoothing layer (e.g. polymer), surface modification layer (e.g. antistat such as polyaniline or polyindole) and the like may be applied prior to application of the first electrode layer. In such embodiments, the first electrode layer is disposed upon but may not directly contact the flexible substrate web. Further, a flexible substrate having a pre-applied first electrode layer may also be employed, exemplary of a batch or step-wise process.

As an alternative to applying a first electrode layer on a flexible (e.g. non-conductive) web, the method may employ advancing a flexible conductive substrate wherein such substrate is suitable for use as the first electrode layer. The conductive substrate may be further coated with a second conductive material that may be more suitable as an electrode for the device. Various metal films and other conductive material that can be provided as a flexible substrate are suitable for this purpose, some of which are subsequently described.

The first electrode layer may be discontinuous in the direction perpendicular (i.e. cross-web direction) to the direction of the advancing web. For example, the first electrode layer 514 may comprise a pattern including at least two stripes wherein the stripes are aligned parallel to the direction of the advancing web, as depicted in FIGS. 1 and 2. Similarly, the first electrode pattern may include a plurality of stripes, striations, etc. as well. The stripes are separated by a portion that is free of the first electrode layer. Such portion may also be continuous in the direction of the advancing web. As exemplified by FIG. 1, the second electrode layer 522 may also be continuous in the direction of the advancing web. Further, as also exemplified by FIG. 1, the second electrode layer 522 may also be continuous in the cross-web direction. Alternatively, however, the second electrode layer may comprises a pattern including at least two stripes wherein the stripes range from being substantially parallel to substantially perpendicular to the first electrode pattern. In addition, provided that the second electrode layer is continuous in the direction of the advancing web, the first electrode layer may be discontinuous and thus comprise, for example, a stripe pattern that is unparallel with respect to the direction of the advancing web. Such stripe pattern may range from being substantially diagonal to substantially perpendicular to the direction of the advancing web.

Alternatively, the first electrode layer may be continuous in the cross-web direction. For such embodiment, the method preferably further comprises applying an insulating layer. The insulating layer may be applied over a portion of the first electrode layer in order to provide the first electrode electrically isolated from the second electrode layer. In another (e.g. subsequent) step the second electrode is applied over the insulting layer. Electrical communication is made on the portion having the insulating layer beneath. Alternatively, the insulating layer may be applied to the flexible substrate web and removed after applying the first electrode layer.

The method optionally further includes applying other optional layers as are known in the art. For example, with reference to FIGS. 1 and 2 at least one hole transport layer 516 may be disposed between the light emitting layer and the anode layer.

For embodiments wherein both electrode layers are continuous in the direction of the advancing web, the cross-section of the device, such as depicted in FIG. 2, is the same throughout the direction of the advancing web. One of ordinary skill in the art appreciates that the cross-section depicted in FIG. 2 is also representative of devices wherein the electrode layer is not continuous in the direction of the advancing web, yet is continuous in the particular exemplified cross-section. Such other devices can be distinguished however, by the cross-section of the device varying in the direction of the advancing web.

Although, the organic light emitting layer may be applied such that it is discontinuous in the direction of the advancing web, the LEP layer is also preferably continuous in the direction of the advancing web. In providing both electrode layer in combination with the organic light emitting layer in this manner, the light-emitting area is also continuous in the direction of the advancing web. In contrast, typical pattern coating that is discontinuous in the direction of the advancing web results in the light-emitting area being bound by the peripheral dimensions of the pattern. Accordingly, the present invention advantageously provides a method of making an OLED device that can vary in size in the direction of the advancing web. A discreet OLED device, having a single continuous light-emitting area 520 can be formed by severing the web, for example in the cross-web direction as depicted by 521 and 523 of FIG. 1. The resulting device has a dimension in the direction of the advancing web spanning from 521 to 523. As is evident by FIG. 1, the continuous layers and in particular the electrode layer is continuous beyond the dimension of the device prior to cutting.

Accordingly, the length of the device of the invention may vary. In order that the device has a uniform brightness for its intended usage life throughout the dimensions of the light-emitting area, the length (i.e. dimension in direction of advancing web) is preferably chosen to minimize the voltage drop across the length of the device. The suitable length for this purpose depends on the conductivity of the electrode layers. Typically a suitable length for a transparent anode layer (e.g. ITO) having a low resistivity of about 10 ohms/square is about 10 inches (25 cm) or less. Preferably the length is no greater than about 6 inches (15 cm). The length is typically at least about 1 inch (2.54 cm) and more preferably at least about 2 inches (5 cm). Typically the smallest dimension (i.e. width in the cross-web direction) of each device is of sufficient size such that the device can be readily joined in electrical communication to another device or a power supply for example by adhering a conductive foil, use of a conductive adhesive, conventional soldering, or ultrasonic welding, as are known in the art. Accordingly, each device typically has a width of at least about ⅛ inch (3.2 mm), preferably of at least about ¾ inch (19 mm), and more preferably of at least about 1 inch (2.54 cm). The width of each individual device is typically no greater than about 2 inches (5 cm), for devices comprising a high resistivity transparent electrode.

Both the anode and cathode electrical contact(s) are preferably accessible along the peripheral edges of the device (e.g. segment). A first electrical contact (e.g. anode) is present on a first peripheral edge. A second electrical contact (e.g. cathode) is present on the same or a different peripheral edge than the first electrical contact. For example, for substantially rectangular devices (e.g. segments), the first electrical contact may be disposed on an edge defining the width of a device (e.g. 521 or 522 of FIG. 1) and the second electrical contact may be disposed on an edge defining the length of the device (i.e. 524 or 525 of FIG. 1). Preferably, however, the second electrical contact is disposed on a peripheral edge opposing the first electrical contact, such as in the case wherein the second electrical contact is disposed on a second peripheral edge parallel to the first peripheral edge. By positioning the electrical contacts on opposing peripheral edges (i.e. opposing ends) multiple devices (e.g. segments) can readily be joined in rows and columns while employing minimal conductive material to join the electrical contacts of the devices such as described in U.S. Pat. No. 7,271,534, entitled "Segmented Organic Light Emitting Device"; incorporated herein by reference. Optionally, the electrodes may extend beyond the outer periphery of the light-emitting structure.

Providing electrical contacts that are accessible along the peripheral edges can be accomplished by trimming away the uncoated flexible transparent substrate up to the electrode layers. Preferably, however, this is accomplished by applying the (e.g. first and second) electrode layers in a manner such that the layers extend to the outer peripheral edges of the flexible substrate. For example, in the embodiment wherein the first electrode layer (e.g. anode) is coated in a pattern having at least two stripes, the electrical contacts are accessible along the peripheral edges 521 or 523 upon severing the web in cross-web direction.

The substrate of the device may be transparent, semi-transparent or opaque. Further, the substrate may be rigid for batch process; yet for continuous roll-to-roll process is flexible. Suitable rigid transparent substrates include, for example, glass, polycarbonate, acrylic, and the like. Suitable flexible transparent substrates include for example, polyesters (e.g., polyethylene terephthalate, polyester naphthalate, and polycarbonate), polyolefins (e.g., linear, branched, and cyclic polyolefins), polyvinyls (e.g., polyvinyl chloride, polyvinylidene chloride, polyvinyl acetals, polystyrene, polyacrylates, and the like), cellulose ester bases (e.g., cellulose triacetate, cellulose acetate), polysulphones such as polyethersulphone, heat-stabilized and heat-set oriented films (e.g. poly(ethylene naphthalate)) and other conventional polymeric films. The substrate may optionally have barrier coatings, static dissipating properties or comprise an anti-static coating. For example, a poly(3,4-ethylenedioxythiophene) poly(styrenesulfonate) aqueous dispersion commercially available from Bayer under the trade designation "Baytron P" may be applied to the substrate followed by application of a barrier layer prior to application of the first electrode layer.

Generally, the electrodes are comprised of conductive materials such as metals, alloys, metallic compounds, conductive metal oxides, conductive ceramics, conductive dispersions, and conductive polymers. Suitable materials can contain, for example, gold, platinum, palladium, nickel, aluminum, calcium, barium, magnesium, titanium, titanium nitride, indium tin oxide (ITO), fluorine doped tin oxide (FTO), graphite, and polyaniline. The electrodes can have a single layer or multiple layers of conductive materials. For example, an electrode can include a layer of aluminum and a layer of gold, a layer of calcium and a layer of aluminum, a layer of aluminum and a layer of lithium fluoride, or a metal layer and a conductive organic layer. For all applications, such as display and lighting applications, at least one of the electrodes (e.g. anode) can transmit radiation emitted by the light-emitting structure. Any of such materials that can be provided in the form of a flexible web may be employed as the conductive flexible substrate.

The anode is generally prepared from a material having a high work function (e.g., above about 4.5 eV). Typically, the anode can transmit radiation emitted by the light-emitting structure. Suitable materials include a thin layer of electronegative metals such as gold, platinum, nickel, graphite, silver, or combinations thereof. The anode can also be prepared from a conductive metal oxide such as, for example, indium-tin oxide.

The cathode is generally prepared from a material having a lower work function than the anode (e.g., below about 4.5 eV). Suitable materials include n-doped silicon, alkali metals, alkaline earth metals, and the like. For example, the cathode can contain lithium, calcium, barium, magnesium, or combinations thereof. Such cathode materials have a tendency to react with water, oxygen, or a combination thereof and can advantageously be protected by encapsulation.

Methods for preparing the electrodes include, but are not limited to, sputtering, vapor deposition, laser thermal patterning, inkjet printing, screen printing, thermal head printing, and photolithographic patterning. The electrodes are most commonly prepared by vapor deposition. As used herein "pattern" with respect to a continuous electrode layer refers to being divided into two or more non-connected parts in the cross-web direction. In some embodiments, the component is patterned by removal of part of the component. For example, the component can be etched for example with the use of strong acids, e.g., to etch the conductive layer. In other embodiments, the component is patterned by deposition of the component. For example, masks or other printing methods can be used prior to electrode deposition and the mask removed after the deposition process is completed.

The light-emitting layer typically contains at least one organic electroluminescent material. The electroluminescent material includes, but is not limited to, a fluorescent or phosphorescent material. The organic electroluminescent material can include, for example, a small molecule (SM) emitter (e.g., a non-polymeric emitter), a SM doped polymer, a light-emitting polymer (LEP), a doped LEP, or a blended LEP. The organic electroluminescent material can be provided alone or in combination with any other organic or inorganic materials that are functional or non-functional in an organic electroluminescent display or device.

In some embodiments, the organic electroluminescent material includes a light-emitting polymer (LEP). LEP materials are typically conjugated polymeric or oligomeric molecules that preferably have sufficient film-forming properties for solution processing. As used herein, "conjugated polymers or oligomeric molecules" refer to polymers or oligomers having a delocalized $\pi$-electron system along the polymer backbone. Such polymers or oligomers are semiconducting and can support positive and negative charge carriers along the polymeric or oligomeric chain.

Examples of classes of suitable LEP materials include poly(phenylenevinylenes), poly(para-phenylenes), polyfluorenes, other LEP materials now known or later developed, and co-polymers or blends thereof. Suitable LEPs can also be molecularly doped, dispersed with fluorescent dyes or photoluminescent materials, blended with active or non-active materials, dispersed with active or non-active materials, and the like. LEP materials can be formed into a light-emitting structure, for example, by casting a solvent solution of the LEP material on a substrate and evaporating the solvent to produce a polymeric film. Alternatively, LEP material can be formed in situ on a substrate by reaction of precursor species. Suitable methods of forming LEP layers are described in U.S. Pat. No. 5,408,109, incorporated herein by reference. Other methods of forming a light-emitting structure from LEP materials include, but are not limited to, laser thermal patterning, inkjet printing, screen printing, thermal head printing, photolithographic patterning, and extrusion coating. The light-emitting structure can include a single layer or multiple layers of LEP material or other electroluminescent material.

In some embodiments, the organic electroluminescent material can include one or more small molecule emitters. SM electroluminescent materials include charge transporting, charge blocking, and semiconducting organic or organometallic compounds. Typically, SM materials can be vacuum deposited or coated from solution to form thin layers in a device. In practice, multiple layers of SM materials are typically used to produce efficient organic electroluminescent devices since a given material generally does not have both the desired charge transport and electroluminescent properties.

SM materials are generally non-polymeric organic or organometallic materials that can be used in OEL displays and devices as emitter materials, charge transport materials, dopants in emitter layers (e.g., to control the emitted color), charge transport layers, and the like. Commonly used SM materials include N,N'-bis(3-methylphenyl)-N,N'-diphenylbenzidine (TPD) and metal chelate compounds such as tris (8-hydroxyquinoline) aluminum (AlQ).

The organic electroluminescent devices can optionally include a hole transporting layer 416, an electron transport layer, a hole injection layer, an electron injection layer, a hole blocking layer, an electron blocking layer, a buffer layer, and the like. These and other layers and materials can be used to alter or tune the electronic properties and characteristics of the OEL devices. For example, such layers and materials can be used to achieve a desired current/voltage response, a desired device efficiency, a desired brightness, and the like. Additionally, photoluminescent materials can be present to convert the light emitted by the organic electroluminescent materials to another color. These optional layers can be positioned between the two electrodes and can be part of the light-emitting layer or a separate layer.

For example, the organic electroluminescent device can optionally include a hole transport layer between the light-emitting structure and one of the first or second electrodes. The hole transport layer facilitates the injection of holes into the device and the migration of the holes towards the cathode. The hole transport layer can further act as a barrier for the passage of electrons to the anode. The hole transport layer can include, for example, a diamine derivative, such as N,N'-bis (3-methylphenyl)-N,N'-bis(phenyl)benzidine, N,N'-bis(3-naphthalen-2-yl)-N,N-bis(phenyl)benzidine, or a triarylamine derivative, such as 4,4',4"-tris(N,N'-diphenylamino) triphenylamine, or 4,4',4"-tris(N-3-methylphenyl-N-phenylamino)triphenylamine. Other examples include copper phthalocyanine and 1,3,5-tris(4-diphenylaminophenyl)benzenes. The organic electroluminescent device can optionally include an electron transport layer between the light-emitting structure and one of the first or second electrodes. The electron transport layer facilitates the injection of electrons and their migration towards the recombination zone. The electron transport layer can further act as a barrier for the passage of holes to the cathode. Preventing the holes from reaching the cathode and the electrons from reaching the anode will result in an electroluminescent device having higher efficiency. Suitable materials for the electron transport layer include, for example, tris(8-hydroxyquinolato) aluminum, 1,3-bis[5-(4-(1,1-dimethylethyl)phenyl)-1,3,4-oxadiazol-2-yl]benzene, 2-(biphenyl-4-yl)-5-(4-(1,1-dimethylethyl)phenyl)-1,3,4-oxadiazole, and other compounds as are known in the art.

The electrodes, light-emitting structure, and/or other optional layers may be formed by transferring one or more layers by laser thermal patterning. For example, the organic electroluminescent material can be coated on a donor sheet and then selectively transferred alone or in combination with other layers or with one or more electrodes to a receptor sheet. The receptor sheet can be pre-patterned with one or more electrodes, transistors, capacitors, insulator ribs, spacers, color filters, black matrix, hole transport layers, electron transport layers, other elements suitable for electronic displays and devices, or a combination thereof.

The device may be encapsulated. As used herein, the term "encapsulated" refers to having the (e.g. cathode) electrode surfaces free of exposure to oxygen and water. For embodiments wherein the devices are individually encapsulated, openings are made in the encapsulant layer to expose the electrical contacts. Depending on the composition of the various components, the useful lifetime of the organic electroluminescent device can be extended by encapsulation. For example, some electrode materials and light-emitting structures deteriorate upon prolonged exposure to oxygen, moisture, or a combination thereof. Encapsulation reduces contact of the second electrode or the light-emitting structure with oxygen or moisture.

The device is typically encapsulated with a non-conductive material including, but is not limited to, ceramic material, glass material, polymeric material, and the like. Such non-conductive material is also suitable for use as the insulting layer. The typical thickness of the encapsulant layer is in the range of about 0.5 mils (0.012 mm) to about 2 mils (0.05 mm); whereas the thickness of the insulting layers is typically ranges from 0.01 microns to 5 microns. Suitable polymeric materials include thermoplastic or thermosetting homopolymers and thermoplastic or thermosetting copolymers. Examples of polymeric materials that can be used include polyurethanes, polyolefins, polyacrylates, polyesters, polyamides, epoxies, or combinations thereof. In some embodiments, the encapsulant polymeric material is an adhesive such as a hot melt adhesive or a pressure sensitive adhesive. The adhesive can be tacky or non-tacky at room temperature. The acidity of the polymeric material is preferably sufficiently low to avoid corrosion of the electrodes. The encapsulant material can include a desiccant such as, for example, CaO, BaO, SrO, and MgO. The encapsulant material can be applied as a pre-formed layer or as a solution or dispersion using printing or patterning methods. A suitable hot melt adhesive containing a desiccant is DesiMax™ from Multisorb Technologies Inc. (Buffalo, N.Y.). A suitable encapsulant includes ethylene vinyl acetate or modified polyolefin thermoplastics such as 3M™ Thermo-bond (available from 3M of St. Paul, Minn.). The device may also be encapsulated in glass sheets as described in U.S. Pat. No. 6,355,125, incorporated herein by reference.

The organic electroluminescent devices described herein can be used, for example, as backlights such as single color (e.g. white) and multiple colored large area lamps (e.g. ceiling panel lighting fixture); fixed and variable message signage (e.g. traffic control) as well as low and high resolution displays such as for use in advertising, toys, personal protection apparel and the like. In the case of conspicuity uses, it is preferred to employ red, orange or yellow coloring optionally in combination with contrasting (e.g. black) indicia or symbols. The device is also suitable for various safety lighting applications (e.g. emergency lighting strips for steps).

Depending on the intended end use the OLED device of the invention may be employed in combination with other optional components. Optional components may include for example one or more polarizers, wave plates, touch panels, antireflective coatings, anti-smudge coatings, projection screens, brightness enhancement films, diffuser or other optical components, coatings, user interface devices, or the like.

Applications for low resolution displays include graphic indicator lamps (e.g., icons); alphanumeric displays (e.g., appliance time indicators); small monochrome passive or active matrix displays; small monochrome passive or active matrix displays plus graphic indicator lamps as part of an integrated display (e.g., cell phone displays); large area pixel display tiles (e.g., a plurality of modules, or tiles, each having a relatively small number of pixels), such as may be suitable for outdoor display used; and security display applications.

Applications for high resolution displays include active or passive matrix multicolor or full color displays; active or passive matrix multicolor or full color displays or graphic indicator lamps and security display applications.

EXAMPLES

Example 1

A UV-curable polymer solution is made containing epoxy acrylate, commercially available from UCB Chemicals, Smyrna, Ga. under the trade designation "Ebecryl 629"; dipentaaerithritol penta acrylate, commercially available from Sartomer Company, Exton, Pa. under the trade designation "SR399"; and 1-hydroxy-cyclohexyl-phenyl ketone, commercially available from Ciba Specialty Chemicals, Tarrytown, N.Y. under the trade designation "Irgacure184" in methyl ethyl ketone. The resulting solution is coated at a web speed of 20 ft/min on a 50 mm wide, 100 micron polyethylene terephthalate ("PET") liner commercially available from Teijin Corp., Japan under the trade designation "HSPE 100" using a microgravure coater commercially available from Yasui Seiki, Japan under the trade designation "Model CAG150" fitted with a 11 OR knurl. The coating is dried in-line at and cured under a nitrogen atmosphere with UV lamp commercially available from Fusion UV systems, Gaithersburg, Md. under the trade designation "F-600 Fusion D UV lamp" operating at 100% power.

A 5 mm wide polymer web mask commercially available from 3M Company, under the trade designation "Scotchpak 1220" is thermally laminated in a roll-to-roll laminator to the UV cured polymer web, and approximately 35 nm of ITO, 10 nm of Ag and 35 nm of ITO is sequentially deposited using a DC sputtering process. The Scotchpak 1220 mask is removed to obtain a web having two conductive stripes that are continuous in the direction of the advancing web separated by a 5 mm uncoated region.

Another 5 mm wide Scotchpak 1220 polymer web mask is thermally laminated in a roll-to-roll laminator to while aligning one of the edges of the web to the edge of the ITO/Ag/ITO coated portion. A hole transport material, (poly(3,4-ethylenedioxythiophene)/poly(styrenesulfonate), commercially available from H. C. Starck, Leverkusen, Germany under the trade designation "PEDOT 8000" also known as PEDT/PSS, is coated onto the ITO surface using a microgravure coater and dried in-line to obtain a PEDOT thickness of about 90 nm.

A poly-phenylene vinelene light-emitting polymer dispersion, commercially available from Covion Organic Semiconductors GmbH, Frankfurt, Germany (0.5 wt % in toluene) under the trade designation "Covion PDY 132 LEP" is coated onto the PEDOT surface using a microgravure coater and dried in-line to obtain a 100 nm thick coating of LEP.

The 5 mm stripe of the polymer web mask is then removed and a 400 Å thick layer of Calcium cathode followed by 4000 Å of Silver is deposited via thermal evaporation onto the LEP surface such that the evaporated metal is in electrical communication with only one of the two ITO/Ag/ITO portions of the web. The web may be severed in the cross-web direction to obtain a discreet device.

This OLED is depicted in FIGS. 1 and 2.

Example 2

The UV cured polymer coated PET web 512 of Example 1 is sequentially coated with 35 nm of ITO, 10 nm of Ag and 35 nm of ITO to obtain a web having an electrically conductive electrode layer 514 that is continuous and substantially cover the entire PET web. A 35 mm Scotchpak 1220 polymer web mask is thermally laminated while aligning to one edge of the 50 mm web.

A thin film insulator 515, e.g. $SiO_2$, SiO, Diamond-like Carbon, $Al_2O_3$, etc., is deposited on to this web by vapor deposition and the polymer web peeled off. The insulating material is pinhole-free and sufficiently thick to prevent shorting of the electroluminescent device when in operation. Preferably, the insulator thickness is 500 nm or less.

A 10 mm Scotchpak 1220 mask is thermally laminated in a roll-to-roll laminator while aligning to the edge that is coated with the insulator.

PEDOT 516 layer and LEP layer 518 are coated as described in Example 1. The Scotchpak mask is peeled off. 400 Å of Ca and 4000 Å of silver 522 are sequentially deposited on this web such that no deposition takes place along a 5 mm portion from the edge opposite to the insulator coated portion. A power supply may be joined in electrical communication with the electrical contacts present on the peripheral edges of the device. In doing so, the light-emitting area emits light.

Figure 3:
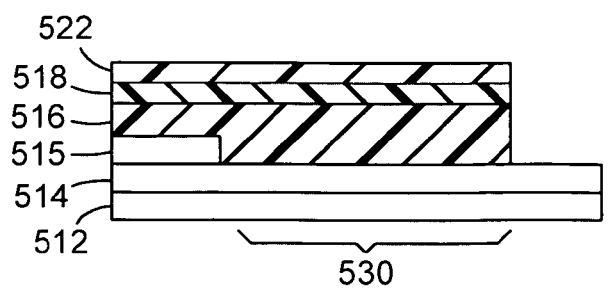
FIG. 3 depicts a cross-sectional view of another exemplary organic light-emitting device.

This OLED is depicted in FIG. 3.

The invention has been described with reference to several specific embodiments foreseen by the inventor for which enabling descriptions are available. Insubstantial modifications of the invention, including modifications not presently foreseen, may nonetheless constitute equivalents thereto. Thus, the scope of the present invention should not be limited by the details and structures described herein, but rather solely by the following claims, and equivalents thereto.

What is claimed is:

1. An organic light-emitting device comprising:
   a transparent flexible substrate;
   a first electrode layer disposed on the substrate;
   an organic light-emitting layer disposed over at least a portion of the first electrode;
   a second electrode layer disposed over at least a portion of the light emitting layer such that the second electrode layer is electrically isolated from the first electrode layer;
   wherein the first electrode layer, second electrode layer, and organic light-emitting layer are continuous for a length of at least 1 inch.

2. The organic light-emitting device of claim 1 wherein the first electrode layer, second electrode layer, and organic light-emitting layer are continuous for a length of at least about 10 inches.

3. The organic light-emitting device of claim 1 wherein the transparent flexible substrate is provided in a roll having a width and length.

4. The organic light-emitting device of claim 3 and the first electrode layer, second electrode layer, and organic light-emitting layer are continuous for the length of the roll.

5. The organic light-emitting device of claim 3 wherein the first electrode layer is applied in a pattern comprising at least two stripes substantially parallel to the length of the roll.

6. The organic light-emitting device of claim 1 wherein the substrate comprises a pair of substantially parallel peripheral edges and the first or second electrode layer extends to the peripheral edges of the substrate.

7. The organic light-emitting device of claim 1 wherein the second electrode layer is electrically isolated from the first electrode layer by means of an insulating layer disposed between the first and second electrode layers.

8. The organic light-emitting device of claim 1 further comprising at least one organic charge transport layer between the light-emitting layer and at least one of the electrode layers.

9. The organic light-emitting device of claim 1 wherein the light-emitting layer is selected from the group comprising small molecule emitter, a small molecule doped polymer, a light-emitting polymer, a doped light-emitting polymer, a blended light-emitting polymer, and combinations thereof.

10. The organic light-emitting device of claim 1 wherein the substrate comprises an anti-static coating.

11. The organic light-emitting device of claim 1 wherein the substrate comprises a barrier coating.

12. The organic light-emitting device of claim 1 wherein at least one electrode layer is transparent.

13. The organic light-emitting device of claim 1 wherein the first electrode layer and the second electrode layer are transparent.

14. The organic light-emitting device of claim 13 wherein the device is encapsulated with a polymeric material.

15. The organic light-emitting device of claim 1 wherein the device is encapsulated.

* * * * *

UNITED STATES PATENT AND TRADEMARK OFFICE
CERTIFICATE OF CORRECTION

PATENT NO. : 7,858,976 B2  
APPLICATION NO. : 12/132651  
DATED : December 28, 2010  
INVENTOR(S) : Raghunath Padiyath It is certified that error appears in the above-identified patent and that said Letters Patent is hereby corrected as shown below:

Column 9  
Line 18, Delete "dipentaaerithritol" and insert -- dipentaerythritol --, therefor.  
Line 54, Delete "vinelene" and insert -- vinylene --, therefor.

Column 9  
Line 30, Delete "11 OR knurl" and insert -- 110R knurl --, therefor.

Signed and Sealed this  
Twenty-second Day of February, 2011

David J. Kappos  
*Director of the United States Patent and Trademark Office*